United States Patent
Cheng et al.

(10) Patent No.: US 9,997,597 B2
(45) Date of Patent: *Jun. 12, 2018

(54) VERTICAL SINGLE ELECTRON TRANSISTOR FORMED BY CONDENSATION

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/671,632

(22) Filed: Aug. 8, 2017

(65) Prior Publication Data

US 2017/0365662 A1 Dec. 21, 2017

Related U.S. Application Data

(63) Continuation of application No. 15/401,471, filed on Jan. 9, 2017, now Pat. No. 9,793,349, which is a (Continued)

(51) Int. Cl.
*H01L 21/00* (2006.01)
*H01L 21/338* (2006.01)
(Continued)

(52) U.S. Cl.
CPC .... *H01L 29/0676* (2013.01); *H01L 21/02532* (2013.01); *H01L 21/02603* (2013.01);
(Continued)

(58) Field of Classification Search
CPC ......... H01L 29/66666; H01L 29/66795; H01L 29/7371; H01L 29/7827; H01L 29/7889;
(Continued)

(56) References Cited

U.S. PATENT DOCUMENTS

| 6,335,245 B2 | 1/2002 | Park et al. |
| 6,894,352 B2 | 5/2005 | Hu et al. |

(Continued)

FOREIGN PATENT DOCUMENTS

| CN | 103928297 A | 7/2014 |
| GB | 2326022 A | 9/1998 |

OTHER PUBLICATIONS

List of IBM Patents or Patent Applications Treated as Related dated Aug. 8, 2017, 2 pages.

(Continued)

*Primary Examiner* — Hsien Ming Lee
(74) *Attorney, Agent, or Firm* — Tutunjian & Bitetto, P.C.; Vazken Alexanian

(57) ABSTRACT

A method for forming a vertical single electron transistor includes forming a heterostructured nanowire having a SiGe region centrally disposed between an upper portion and a lower portion in the nanowire. An oxide is deposited to cover the SiGe region, and a condensation process is performed to convert the SiGe to oxide and condense Ge to form an island between the upper portion and the lower portion of the nanowire. A bottom contact is formed about the lower portion, a first dielectric layer is formed on the bottom contact and a gate structure is formed about the island on the first dielectric layer. A second dielectric layer is formed on the gate structure, and a top contact is formed on the second dielectric layer.

20 Claims, 10 Drawing Sheets

Related U.S. Application Data continuation of application No. 15/092,986, filed on Apr. 7, 2016, now Pat. No. 9,595,605.

(51) Int. Cl.
| | |
|---|---|
| *H01L 21/337* | (2006.01) |
| *H01L 29/74* | (2006.01) |
| *H01L 31/0328* | (2006.01) |
| *H01L 29/06* | (2006.01) |
| *H01L 29/66* | (2006.01) |
| *H01L 21/306* | (2006.01) |
| *H01L 21/02* | (2006.01) |
| *H01L 29/51* | (2006.01) |
| *H01L 29/78* | (2006.01) |

(52) U.S. Cl.
CPC ........ *H01L 21/30604* (2013.01); *H01L 29/51* (2013.01); *H01L 29/66666* (2013.01); *H01L 29/7827* (2013.01)

(58) Field of Classification Search
CPC ............. H01L 29/7926; H01L 27/0886; H01L 27/0924; H01L 27/1211; H01L 21/823431; H01L 21/823487; H01L 21/823821; H01L 21/823885
USPC ............... 438/156, 172, 173, 192, 212, 268; 257/135, 192, 220, 263, 302, 328, 329
See application file for complete search history.

(56) References Cited

U.S. PATENT DOCUMENTS

| | | |
|---|---|---|
| 6,998,310 B2 | 2/2006 | Fraboulet et al. |
| 7,361,592 B2 | 4/2008 | Morand et al. |
| 7,547,932 B2 | 6/2009 | Zhang et al. |
| 7,826,336 B2 | 11/2010 | Thelander et al. |
| 8,703,565 B2 | 4/2014 | Chang et al. |
| 9,595,605 B1 * | 3/2017 | Cheng ................ H01L 29/7613 |

OTHER PUBLICATIONS

Chen, G.L. et al., "Room-temperature Observation of Large Coulomb-blockade Oscillations from Germanium Quantum-dot Single-hole Transistors with Self-aligned Electrodes" Proceedings of the 7th IEEE International Conference on Nanotechnology (Aug. 2007) pp. 1313-1316.

Chen, Z.J. et al., "Ge Condensation Characterization of SiGe-On-Insulator Structure fabricated by Separation of Oxygen Implantation" IEEE (2004) pp. 2187-2189.

* cited by examiner

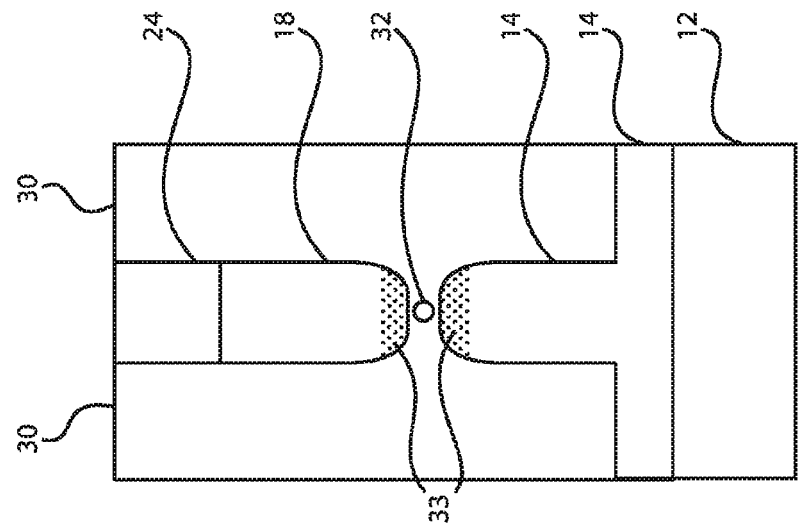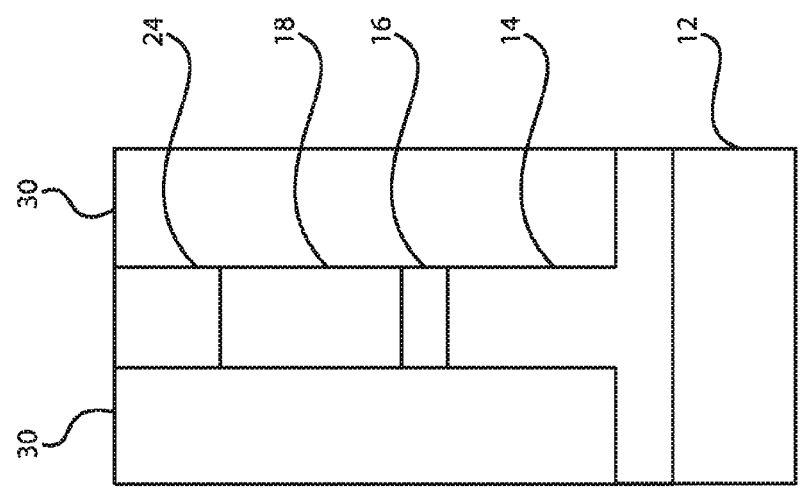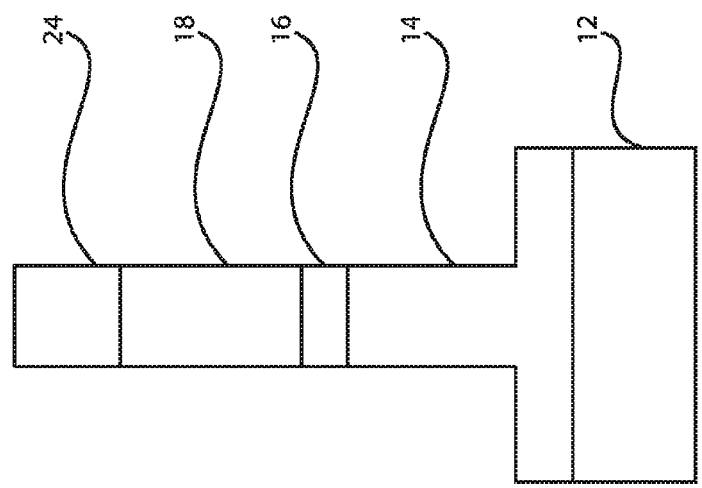

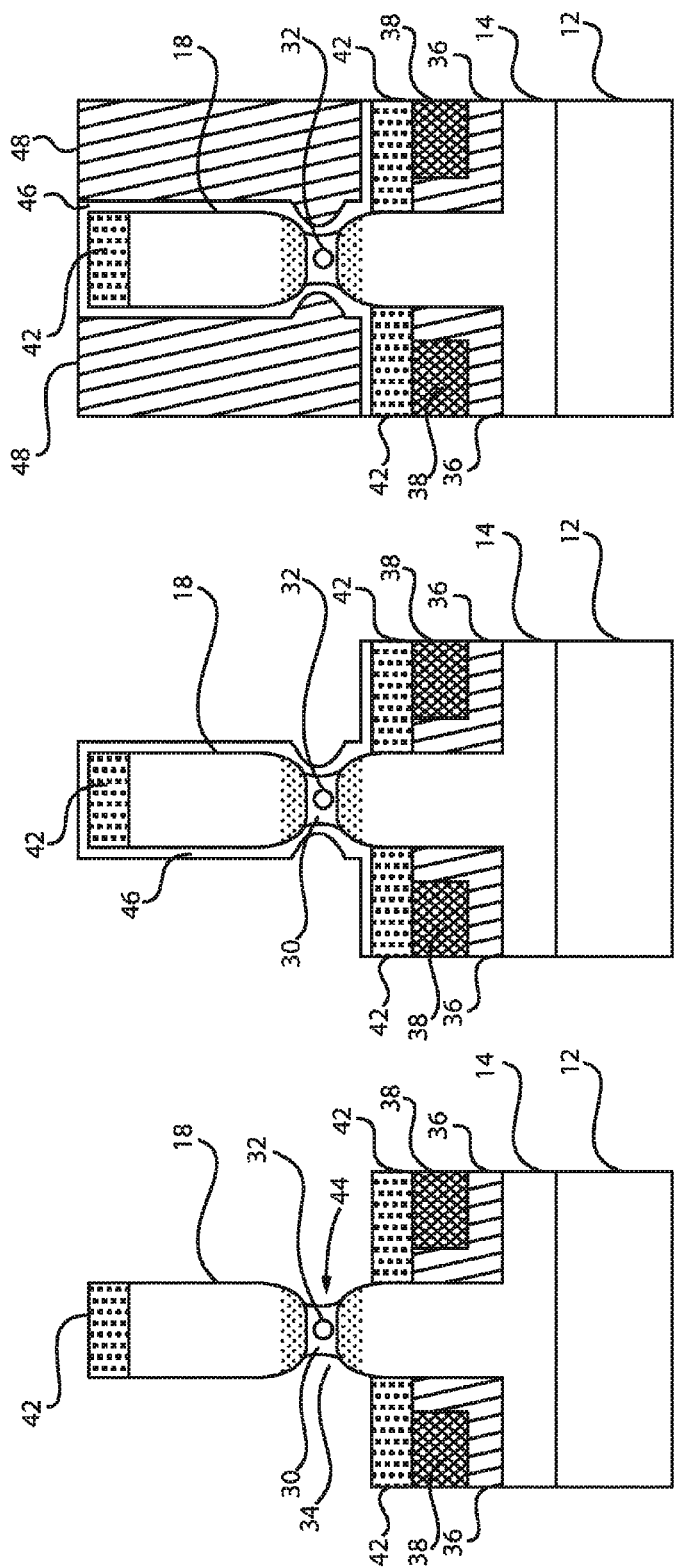

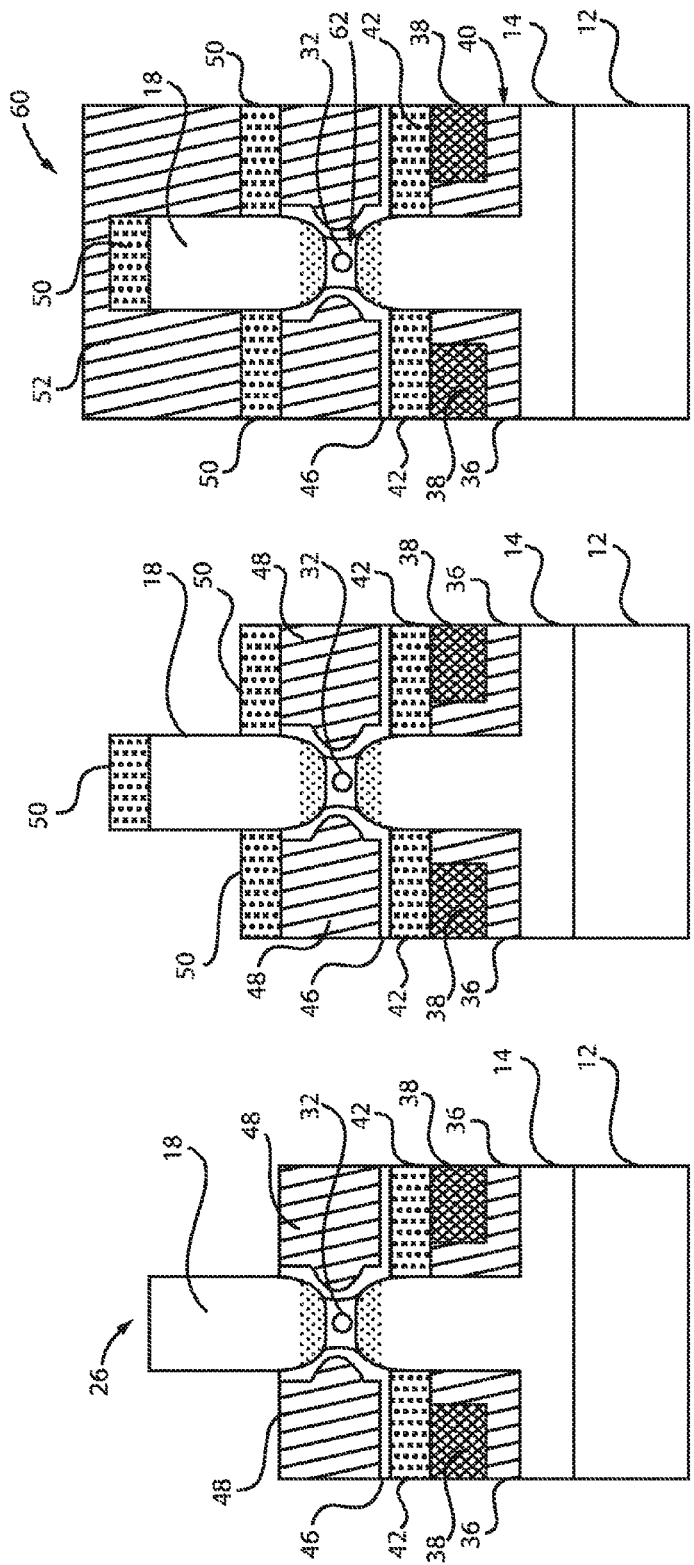

VERTICAL SINGLE ELECTRON TRANSISTOR FORMED BY CONDENSATION

BACKGROUND

Technical Field

The present invention relates to semiconductor devices and processing, and more particularly to structures and methods for forming the structures, which include a vertical single electron transistor device.

Description of the Related Art

With decreasing node sizes, the semiconductor industry has been looking for alternate designs to conventional complementary metal oxide semiconductor (CMOS) technology. These alternatives need to provide at least comparable performance in a smaller chip area. Single electron transistors (SET) are being researched as a potential device option beyond conventional CMOS devices. However, in order to operate at higher temperature, SET needs to have a very small island, which is very difficult to achieve by conventional processing.

SUMMARY

A method for forming a vertical single electron transistor includes forming a heterostructured nanowire having a SiGe region centrally disposed between an upper portion and a lower portion in the nanowire. An oxide is deposited to cover the SiGe region, and a condensation process is performed to convert the SiGe to oxide and condense Ge to form an island between the upper portion and the lower portion of the nanowire. A bottom contact is formed about the lower portion, a first dielectric layer is formed on the bottom contact, and a gate structure is formed about the island on the first dielectric layer. A second dielectric layer is formed on the gate structure, and a top contact is formed on the second dielectric layer.

Another method for forming a vertical single electron transistor includes forming a nanowire from a first doped silicon layer, a SiGe layer, and a second doped silicon layer on a semiconductor substrate; depositing an oxide to cover the nanowire; performing a condensation process to convert the SiGe to oxide and condense Ge to form an island between the first doped silicon layer and the second doped silicon layer of the nanowire; forming a source region about the first doped silicon layer; forming a gate structure about the island between the first doped silicon layer and the second doped silicon layer of the nanowire; and forming a drain region about the second doped silicon layer.

A vertical single electron transistor includes a nanowire having a lower doped layer and an upper doped layer. A dielectric gap is disposed between the lower doped layer and the upper doped layer. A quantum dot is formed within the dielectric gap and encapsulated in dielectric material. A source region formed about one of the lower doped layer and the upper doped layer. A gate structure is formed about the quantum dot. A drain region is formed about the other of the lower doped layer and the upper doped layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 4 is a cross-sectional view of a nanowire of FIG. 3 after the fin cut etch in accordance with the present principles;

FIG. 5 is a cross-sectional view of the nanowire of FIG. 4 after formation of an oxide in accordance with the present principles;

FIG. 6 is a cross-sectional view of the nanowire of FIG. 5 after a condensation process where some of the SiGe is converted to oxide, some Ge is diffused into the doped silicon layers and some condenses to form a quantum dot in accordance with the present principles;

FIG. 13 is a cross-sectional view of the nanowire of FIG. 12 after trimming (etching) a region (oxide) around the quantum dot to provide a gate dielectric dimension in accordance with the present principles;

FIG. 14 is a cross-sectional view of the nanowire of FIG. 13 after depositing a high-k material to form the gate dielectric in accordance with the present principles;

FIG. 15 is a cross-sectional view of the nanowire of FIG. 14 after depositing a gate conductor in accordance with the present principles;

FIG. 16 is a cross-sectional view of the nanowire of FIG. 15 after recessing the gate conductor in accordance with the present principles;

FIG. 17 is a cross-sectional view of the nanowire of FIG. 16 after forming another directionally deposited dielectric material over the gate conductor in accordance with the present principles;

FIG. 18 is a cross-sectional view of the nanowire of FIG. 17 after depositing a top electrode (e.g., source) in accordance with the present principles;

DETAILED DESCRIPTION

Figure 1:
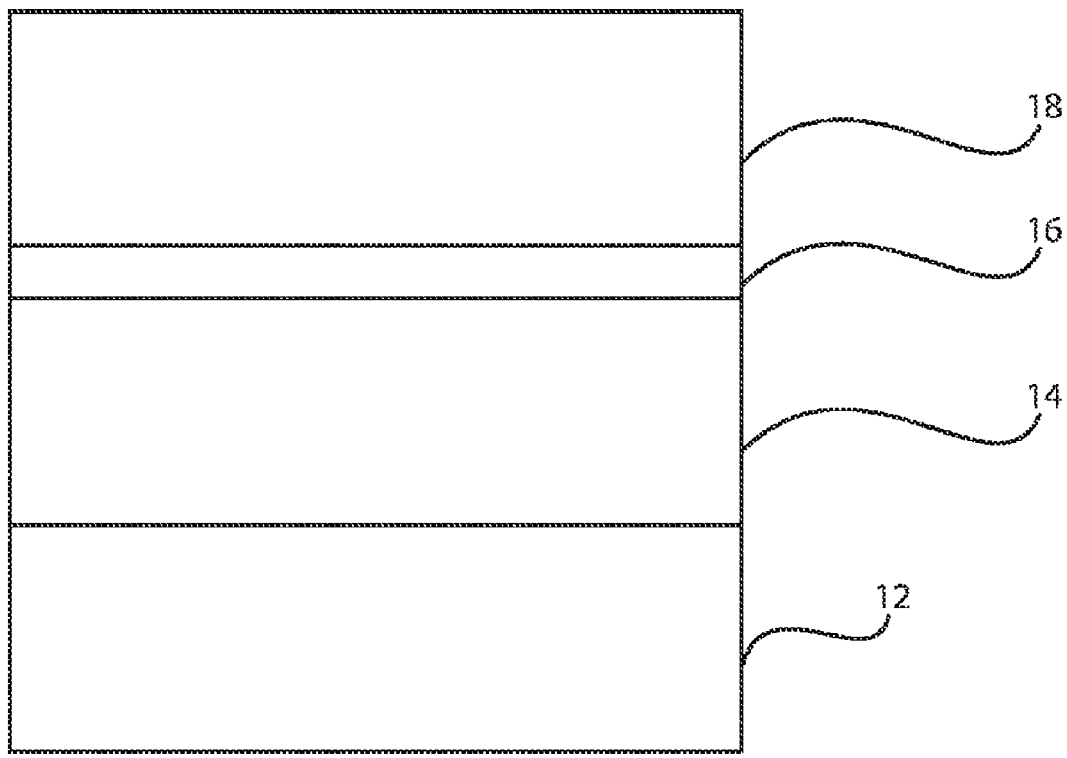
FIG. 1 is a cross-sectional view of a stack of layers showing a substrate, a doped silicon layer, a doped SiGe layer, and another doped silicon layer in accordance with the present principles.

In accordance with the present principles, single electron transistor (SET) structures and methods for fabrication are provided. The SET structure may be formed vertically to conserve layout area. The SET structure may be formed using nanowire technology or other vertically oriented fabrication methods. The SET structure employs a quantum dot or island formed by a condensation technique. The quantum dot may include, e.g., Ge or SiGe.

In one embodiment, a SiGe layer is sandwiched between upper and lower Si layers in a vertical structure (e.g., nanowire). Some Ge from the SiGe layer is incorporated into an upper Si layer and into a lower Si layer by the condensation process, and some Ge gets repelled into center location between the upper and lower Si layers and forms a Ge quantum dot embedded in a dielectric material (e.g., oxide).

The quantum dot preferably includes a diameter of less than about 6 nm. The vertical single electron transistor has a unique structure with an extremely small island formed by condensation to provide a space efficient and high performing transistor device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a device 10 includes a substrate 12. The substrate 12 may include a bulk semiconductor material or a semiconductor layer of a semiconductor-on-insulator (SOI) substrate. The substrate 12 may include Si, SiGe, SiC, Ge, a III-V material (e.g., InP, InGaAs, GaAs, etc.) or any other suitable substrate material. In one particularly useful embodiment, the substrate 12 includes monocrystalline Si.

Multiple layers are formed on the substrate 12. These layers include a sandwich of epitaxially grown materials. The epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material).

In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one embodiment, a doped Si layer 14 is epitaxially grown on the substrate 12 followed by a doped SiGe layer 16 and another doped Si layer 18. The dopant concentration in layers 14, 16 and 18 can be from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. Other dopant concentrations may also be employed. When SiGe is epitaxially grown, the SiGe may have germanium content in the range of 5% to 80%, or preferably between 20% and 60%. Silicon and/or the SiGe may be doped with n-type dopants (e.g., phosphorus or arsenic) or p-type dopants (e.g., boron or gallium), depending on the type of transistor.

Figure 2:
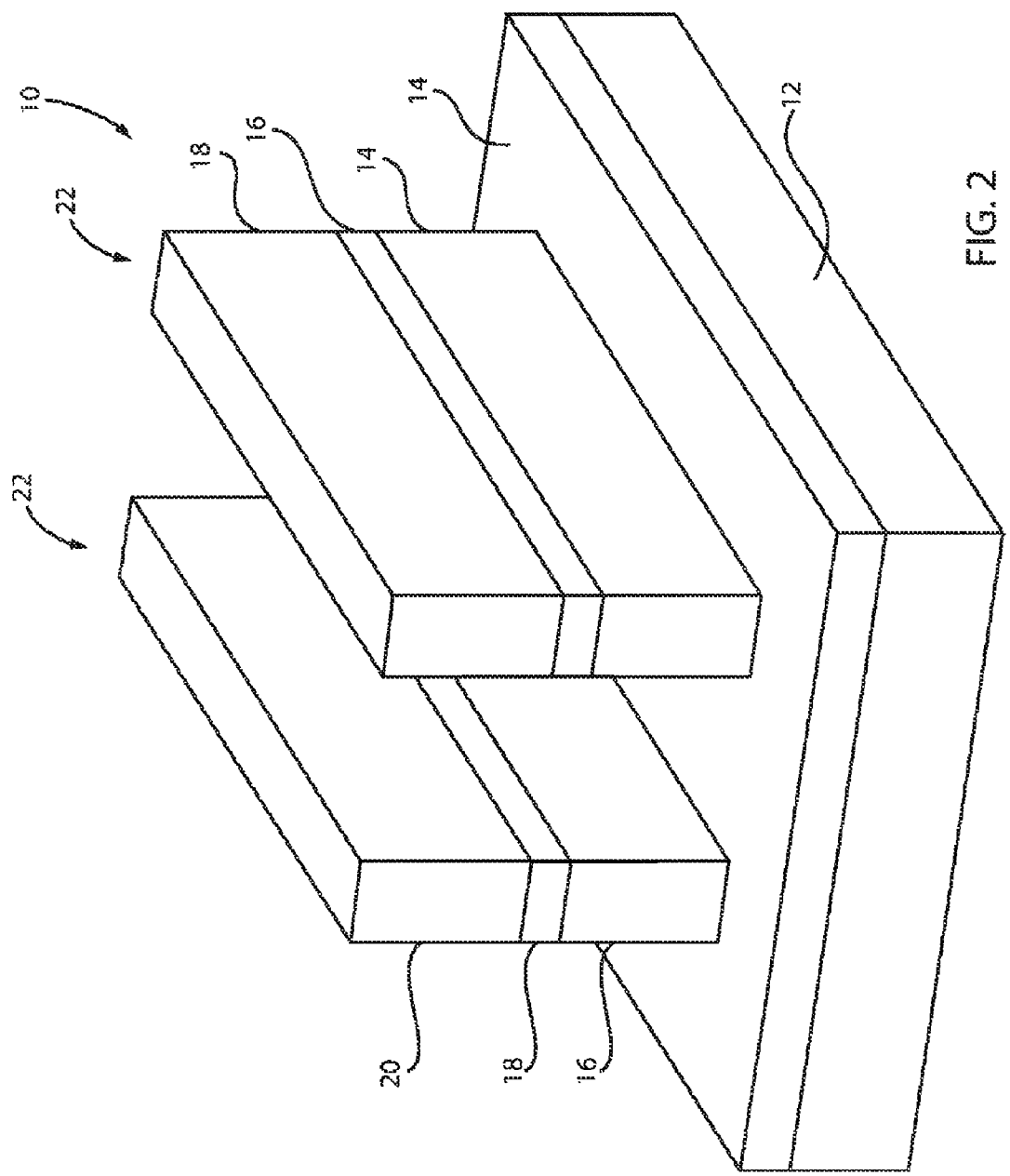
FIG. 2 is a perspective view of the stack of layers of FIG. 1 after lithographically patterning the stack to form fins in accordance with the present principles.

Referring to FIG. 2, fins 22 are formed from the doped layers 14, 16 and 18. The fins 22 may be formed by dry etching with a lithographically patterned hardmask (not shown). The dry etch, e.g., a reactive ion etch, exposes the layer 14, and a portion of the thickness of the layer 14 remains after the etch process. The hardmask may be patterned using spacer image transfer (SIT), lithography or other patterning technique. After the formation of the fins 22, the hardmask can be stripped off.

Figure 3:
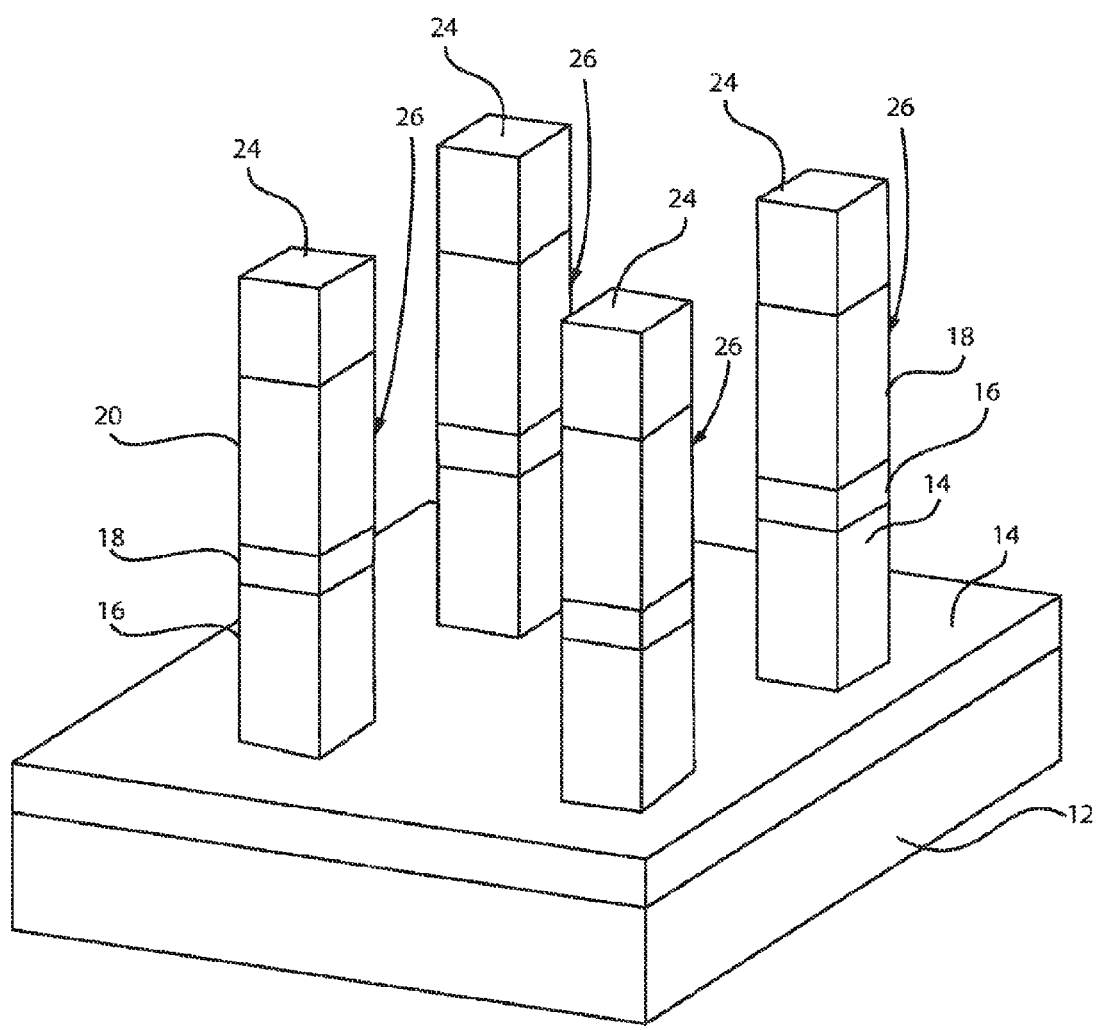
FIG. 3 is a perspective view of the stack of layers of FIG. 2 after lithographically patterning the fins in a fin cut etch to form nanowires in accordance with the present principles.

Referring to FIG. 3, a fin cut (e.g., etching) process is performed to form vertical nanowires 26. A hard mask 24 is formed on the fins 22 and patterned to provide an etch mask for the fin cut etch. The hardmask 24 is maintained on top of the nanowires 26 for further processing.

Referring to FIG. 4, a cross-sectional view of a single nanowire 26 of FIG. 3 is depicted for further processing. The single nanowire 26 includes the hardmask on the layer 18.

Referring to FIG. 5, a dielectric 30, such as an oxide is deposited on the nanowire 26. The dielectric (oxide) 30 may be planarized down to the hardmask 24. The oxide 30 may be deposited using a chemical vapor deposition process, a spin-on process or other suitable deposition process. The oxide 30 buries the nanowire 26 so that the oxide 30 is in contact with the SiGe layer 16.

Referring to FIG. 6, a condensation process is performed to condense Ge from the SiGe layer 16 to form a Ge dot 32 embedded in oxide 30 at a center between an upper layer 18 and a lower layer 14. During condensation, heat is applied to condense Ge and to oxidize the Si of layer 16. The condensation process includes annealing at a temperature between about 600 degrees C. to about 1050 degrees C. The condensation forms the dot 32, which is a quantum dot having a diameter of less than about 6 nm. The size of the dot 32 can be controlled by the concentration of Ge in the layer 16 and/or the dimensions of the layer 16. The dot 32 is suspended in the oxide 30 within a gap 34 between the upper Si layer 18 and the lower Si layer 14. Portions 33 of layers 14 and 18 may include SiGe with the concentration depending on the condensation process.

Figure 7:
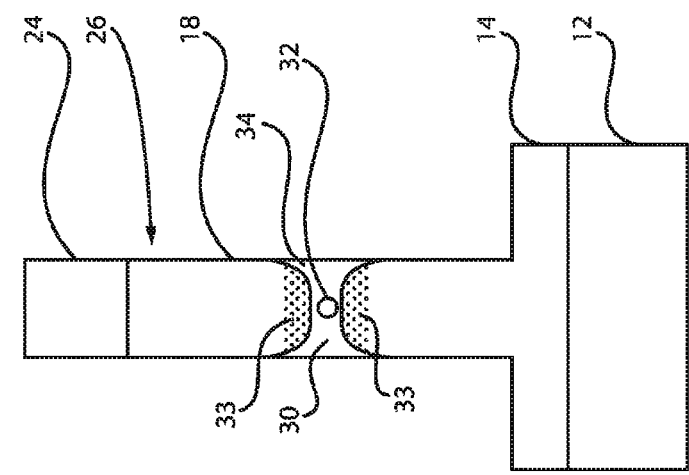
FIG. 7 is a cross-sectional view of the nanowire of FIG. 6 after the oxide is removed in accordance with the present principles.

Referring to FIG. 7, the oxide 30 is removed from sidewalls of the layers 14 and 18 by a directional etch. The directional etch (e.g., RIE) etches oxide directionally using hardmask 24 to protect the top of nanowire 26. The oxide 30 remains in the gap 34.

Figure 8:
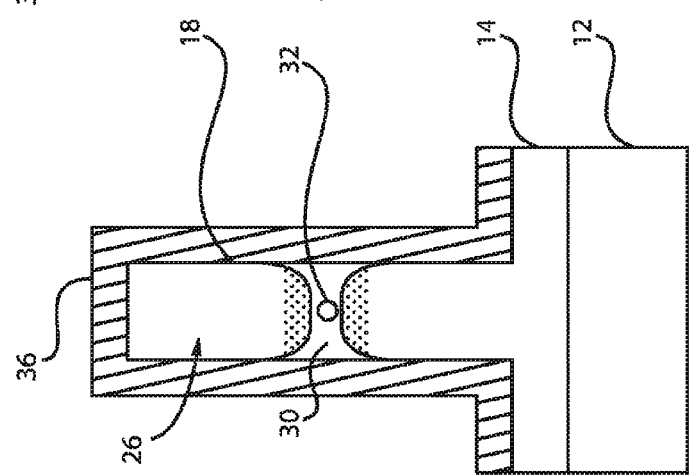
FIG. 8 is a cross-sectional view of the nanowire of FIG. 7 after conformal deposition of a bottom contact material in accordance with the present principles.

Referring to FIG. 8, the hardmask 24 is stripped to expose layer 18. A bottom contact 36 is conformally deposited over the top and sides of the nanowire 26 and on horizontal portions of layer 14. The bottom contact 36 may be deposited by atomic layer deposition (ALD), although other deposition processes may be employed.

The bottom contact 36 may include a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), a carbon nanotube, conductive carbon, graphene, or any suitable combination of these materials.

Figure 9:
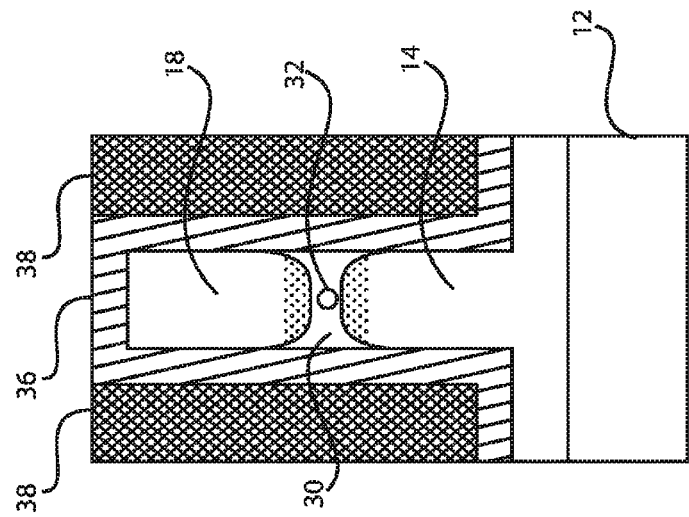
FIG. 9 is a cross-sectional view of the nanowire of FIG. 8 after deposition of a dielectric material over the bottom contact material in accordance with the present principles.

Referring to FIG. 9, a filling dielectric 38 is deposited over the bottom contact 36. The filling dielectric 38 is planarized to the top of the bottom contact layer 36. The planarization process may include a chemical mechanical polishing (CMP) process.

Figure 10:
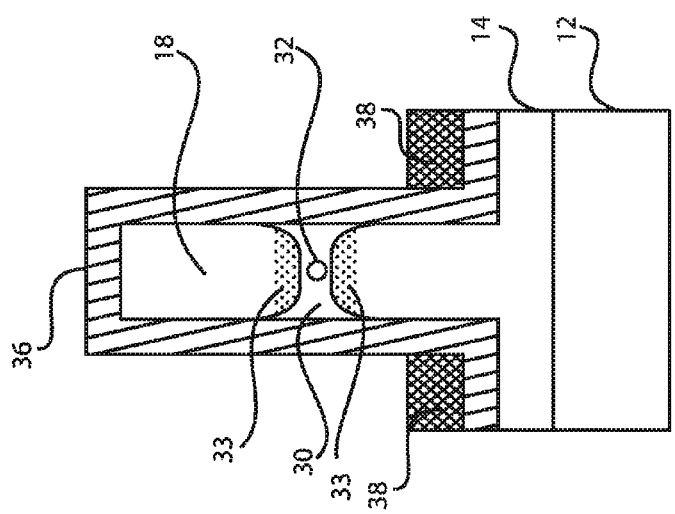
FIG. 10 is a cross-sectional view of the nanowire of FIG. 9 after recessing of the dielectric material over the bottom contact material in accordance with the present principles.

Referring to FIG. 10, the filling dielectric 38 is recessed, e.g., by a timed etch. The filling dielectric 38 is removed down to a height to provide a cut off position for forming a bottom contact. The timed etch may include a RIE selective to the contact layer 36.

Figure 11:
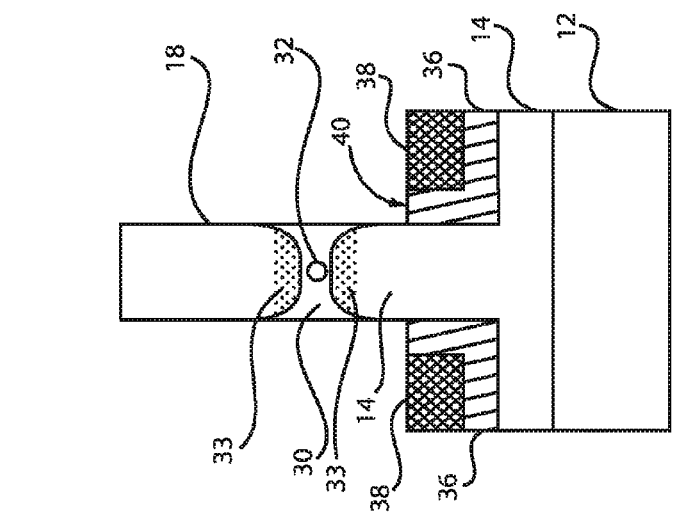
FIG. 11 is a cross-sectional view of the nanowire of FIG. 10 after recessing of the bottom contact material to form a bottom contact (e.g., drain) in accordance with the present principles.

Referring to FIG. 11, another etch process is performed to remove exposed portions of the bottom contact layer 36. Portions of the bottom contact layer 36 are protected from the etch and form a bottom contact 40. The etch is selective to the materials of layers 14, 18, 30 and 38. The etch process may include a wet or a dry etch.

Figure 12:
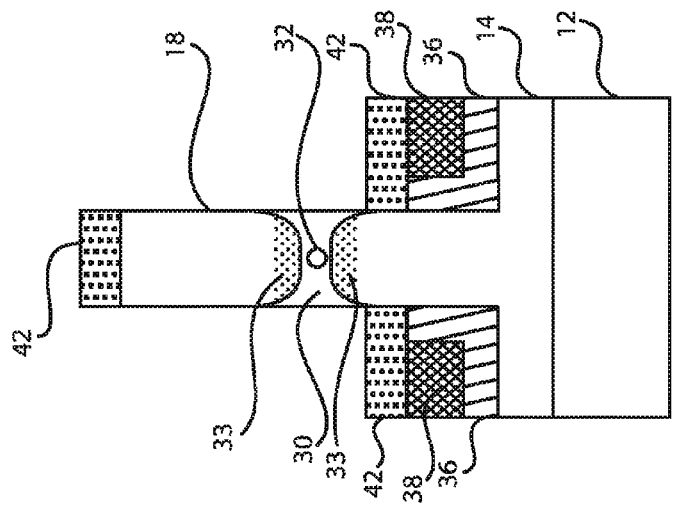
FIG. 12 is a cross-sectional view of the nanowire of FIG. 11 after forming a directionally deposited dielectric material over the bottom contact in accordance with the present principles.

Referring to FIG. 12, a spacer layer 42 is formed by a directional deposition method. The spacer layer 42 is formed on horizontal surfaces of the layer 18, contact layer 36 and dielectric layer 38. The spacer layer 42 may be formed by a directional deposition process. The spacer layer 42 is preferably nitride, although other dielectric materials may be employed.

The directional deposition includes a film-forming gas introduced to a gas cluster ion beam (GCIB) to produce a film-forming GCIB, and a plurality of gas clusters collectively move together as the film-forming GCIB in a direction towards a target. A pressurized gas mixture is expanded into a reduced pressure environment to form gas-clusters, the gas-clusters are ionized, and the ionized gas-clusters are accelerated and optionally filtered.

The surfaces for deposition are exposed to the film-forming GCIB and, the direction of incidence of the GCIB is substantially perpendicular to the surface plane where the layer 42 is to be formed. The impact of multiple gas clusters on the one or more horizontal surfaces causes the formation of the deposited layer 42 on the one or more horizontal surfaces (e.g., on the layer 18, the bottom contacts 36 and the dielectric layer 38), while causing substantially insignificant formation of a deposited film on the one or more vertical surfaces. Directional deposition can occur on any surface oriented to lie in a plane perpendicular to the direction of incidence of the GCIB.

As the gas clusters collide with the one or more horizontal surfaces, material is infused in the surface layer or the underlying layer or is formed on the surface layer. As the GCIB dose is increased, the infusion of material transitions to the deposition of material on the surface. Amorphous films having a variety of material compositions that can be produced, and anisotropic (or directional) deposition can be achieved using the GCIB. Once the amorphous film is formed, it may be subjected to one or more thermal cycles (e.g., elevation of temperature) to crystallize the film.

Layer 42 compositions may include Si and O, Si and N; Si, C and N; Si, O and C; etc. For example, amorphous silicon oxide, amorphous silicon nitride, amorphous silicon oxynitride, amorphous silicon carbonitride, amorphous silicon oxycarbonitride, etc. can be formed. According to one example, layer 42 may include Si and N deposited using the introduction of silane ($SiH_4$), and a nitrogen-containing gas such as $N_2$ or $NH_3$ to a GCIB. According to another example, Si and O may be deposited using the introduction of silicon tetrafluoride ($SiF_4$), and an oxygen-containing gas such as $O_2$ to a GCIB. In yet another example, layer 42 may include Si, O and N deposited using the introduction of silicon tetrafluoride ($SiF_4$), an oxygen-containing gas such as $O_2$, and a nitrogen-containing gas such as $N_2$ or $NH_3$ to a GCIB. Alternatively, the oxygen-containing gas and the nitrogen-containing gas may include NO, $NO_2$, or $N_2O$, or a combination of two or more thereof. According to another example, layer 42 may include Si, O, N and C deposited using the introduction of silicon tetrafluoride ($SiF_4$), an oxygen-containing gas such as $O_2$, a nitrogen-containing gas such as $N_2$ or $NH_3$, and methane ($CH_4$) to a GCIB.

In any one of the examples provided above, additional gases can be provided including an inert gas, such as a noble gas. Gas mixtures may be selected based upon compatibility, stability or other criteria.

Referring to FIG. 13, an etch process is performed to etch or trim the oxide 30 in a gate region (e.g., gap 34 between layers 18 and 14). The etch process may include a dry etch that is selective to layer 14, layer 18 and layer 42. The etch process causes divots 44 to form reducing a thickness of the oxide 30 around the dot 32. The divots 44 provide a necked down region in an area around the quantum dot 32. This etch dimensions the dielectric (e.g., oxide) encapsulating the quantum dot 32 for use as at least a portion of a gate dielectric.

Referring to FIG. 14, a high dielectric constant (high-k) material 46 is conformally deposited over the device. In one embodiment, the high-k material 46 is deposited using an ALD process. The high-k material and the remaining oxide materials 30 provide a gate dielectric.

Referring to FIG. 15, a gate conductor 48 is formed over the high-k material 46. The gate conductor 48 may include conductive materials, such as, e.g., a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), a carbon nanotube, conductive carbon, graphene, or any suitable combination of these materials. The conductive material may further comprise dopants that are incorporated during or after deposition. The gate conductor 48 is planarized (e.g., CMP) down to the high-k material 46.

Referring to FIG. 16, the gate conductor 48 is recessed to be centered about the dot 32. The gate conductor 48 is recessed using, e.g., RIE. Then, the high-k material 46 is stripped followed by the spacer layer 42 on layer 18 on top of the nanowire 26.

Referring to FIG. 17, another spacer layer 50 is formed on top of the layer 18 and on top of the recessed gate conductor 48. The top spacer layer 50 is preferably deposited using a directional deposition, such as e.g., a GCIB process.

Referring to FIG. 18, a top contact material 52 is formed over the spacer 52. The top contact material 52 may be planarized, e.g., using a CMP process. In this structure, the quantum dot 32 forms a device channel, which is selectively activated by applying a voltage to the gate conductor 48.

In accordance with the present principles, a vertical single electron transistor 60 is provided where the top contact material 52 functions as a drain and the bottom contact 40 functions as a source. These may be reversed in some embodiments. The gate conductor 48 surrounds a central region 62. The central region 62 includes the quantum dot 32 (or island) and functions as a transistor channel (with, e.g., tunnel barriers in the central region 62 on the source and drain sides). When a threshold voltage is achieved on the gate conductor 48, conduction begins between the source and drain regions. The transistor 60 is vertically arranged to permit thin nanowire regions to be employed in the formation of the quantum dot 32. In addition, space savings are achieved by the vertical arrangement of the transistor(s) 60.

Figure 19:
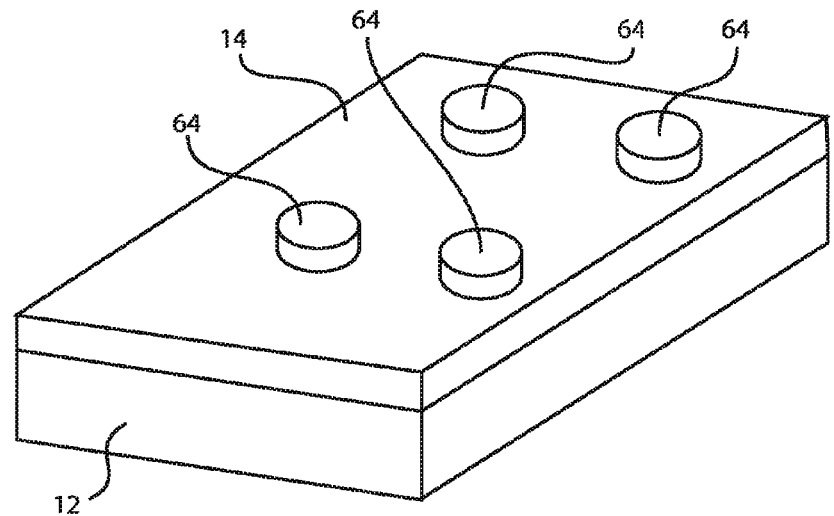
FIG. 19 is a perspective view of a substrate having metal seeds patterned thereon in accordance with the present principles.

Referring to FIGS. 18 and 19, in other embodiments, heterostructured vertical nanowires 66 may be formed using other processes. In one embodiment, nanowires 66 can also be formed by a vapor liquid solid (VLS) growth method. The VLS method grows one-dimensional structures, such as nanowires 66, from chemical vapor deposition. The growth of a crystal through direct adsorption of a gas phase onto a solid surface is generally very slow. The VLS mechanism circumvents this by introducing a catalytic liquid alloy phase which can rapidly adsorb a vapor to supersaturation levels, and from which crystal growth can subsequently occur from nucleated seeds 64 at the liquid-solid interface. The physical characteristics of nanowires 66 grown in this manner depends, in a controllable way, upon the size and physical properties of the liquid alloy.

Figure 20:
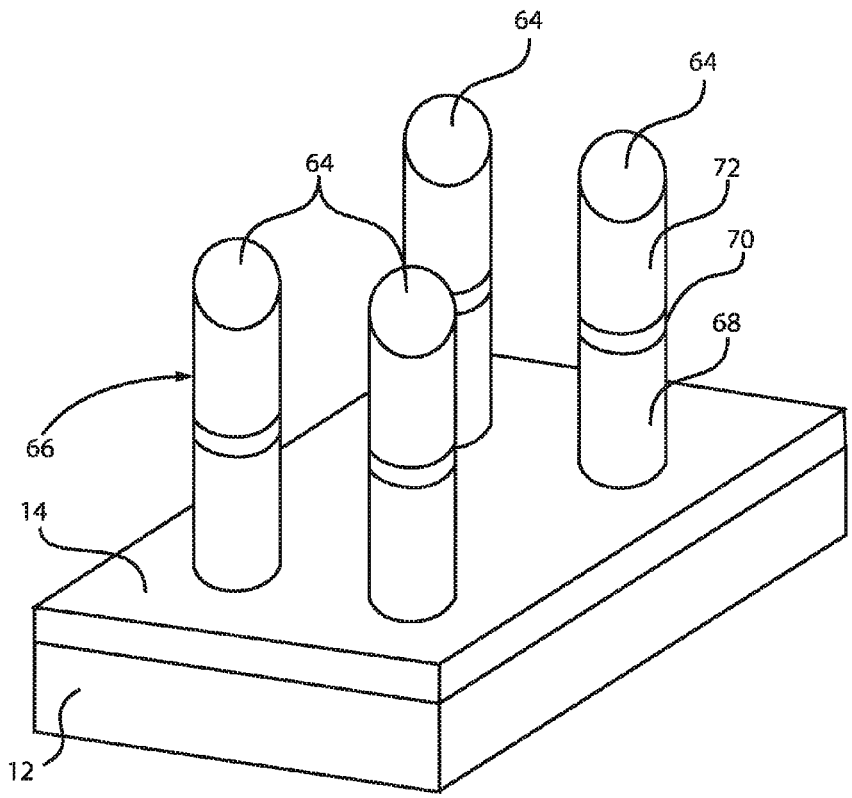
FIG. 20 is a perspective view showing growth of a heterostructure using the metal seeds to form nanowires in accordance with the present principles.

In one particularly useful embodiment, a metal seed layer is deposited on the doped silicon layer 14 (FIG. 19). The metal seed layer may include Au, although other catalysts may be employed. The metal seed layer may include a thickness of between about 1 to about 20 nm. The metal seed layer is patterned to form seeds 64 for nanowire formation sites. In FIG. 20, nanowires 66 are grown using, e.g., a metal organic chemical vapor deposition process (MOCVD). The MOCVD process may be changed to form the heterostructure, e.g., doped Si 68, doped SiGe 70 and doped Si 72. The seeds 64 may be etched or otherwise removed and processing may continue as described above.

The SiGe layer 70 may be employed for forming a quantum dot by condensation as described above. In addition, the condensation method described herein may be employed for forming/growing Ge quantum dots in nanowires in any crystallographic direction.

Figure 21:
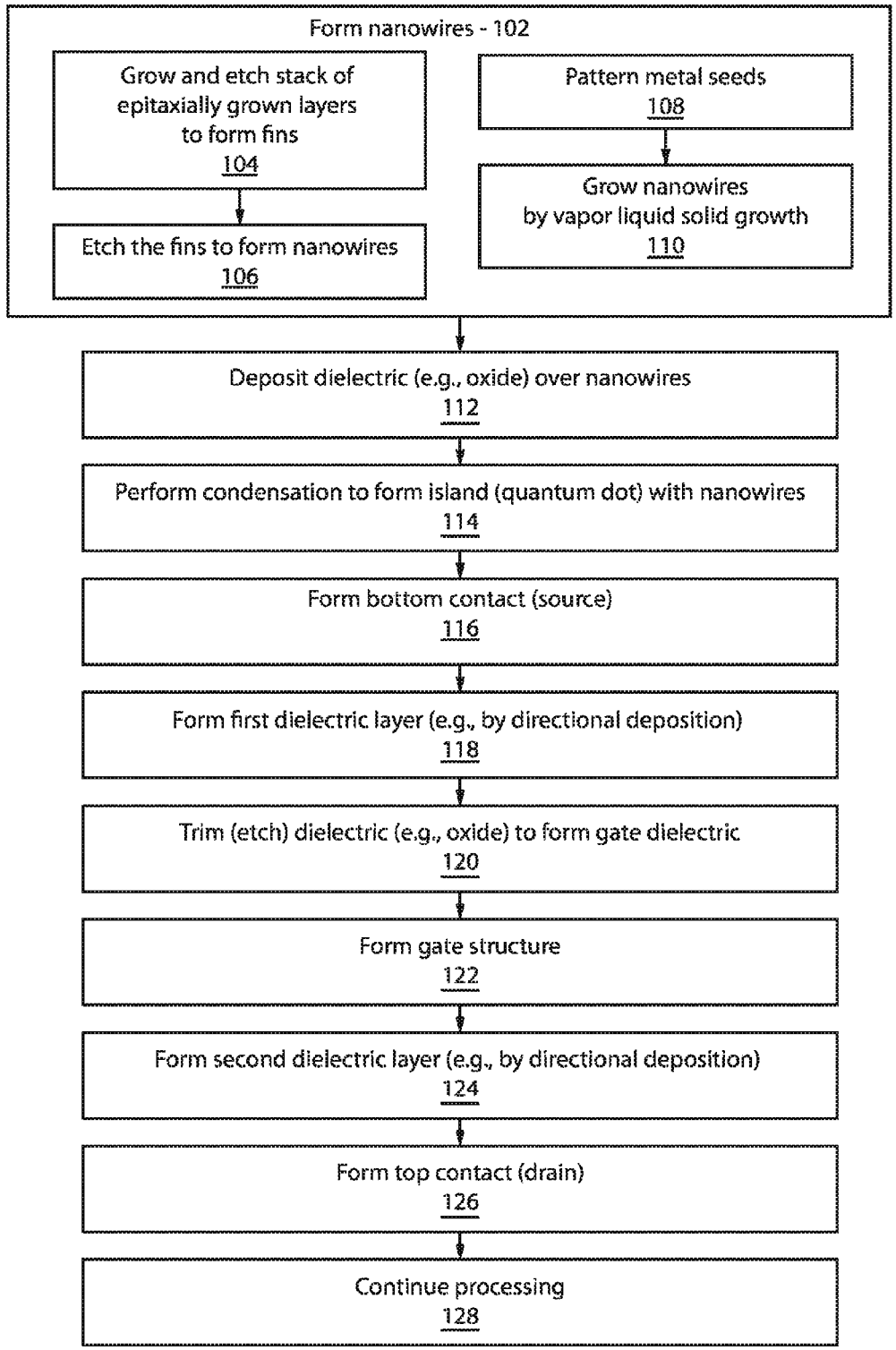
FIG. 21 is a block/flow diagram showing methods for forming a vertical single electron transistor in accordance with illustrative embodiments.

Referring to FIG. 21, methods for forming a vertical single electron transistor are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a heterostructured nanowire is formed having a SiGe region centrally disposed between an upper portion and a lower portion in the nanowire. The heterostructured nanowire may be grown as a nanowire or etched from grown layers.

In one embodiment, a stack of epitaxially grown layers may be lithographically etched to form one or more fins in block 104. In block 106, the one or more fins may be lithographically etched in a fin cut etch to form one or more nanowires. In another embodiment, the heterostructured nanowire may be formed by patterning metal seeds deposited on a semiconductor layer in block 108. In block 110, nanowires are grown by a vapor liquid solid growth method. In one embodiment, the nanowire structure includes a first doped Si layer on a substrate, a SiGe layer on the first doped Si layer and a second doped Si layer on the SiGe layer.

In block 112, a dielectric is deposited, such as an oxide, to cover the nanowire and, in particular, the SiGe region. In block 114, a condensation process is performed to convert the SiGe to oxide and condense Ge to form an island between the upper portion and the lower portion of the nanowire. Some Ge may diffuse into adjacent Si materials. The condensation process includes exposing the SiGe to a temperature of between 600 degrees to about 1050 degrees to condense the Ge to form an island. In one embodiment, the island includes a quantum dot having a diameter of less than about 6 nm. The quantum dot is encapsulated in the dielectric (e.g., oxide).

In block 116, a bottom contact is formed about the lower portion. This may include conformally depositing a conductive material over the nanowire, depositing a dielectric material over the conductive material, recessing the dielectric material and then etching the conductive material to form a bottom contact (e.g., source).

In block 118, a first dielectric layer is formed on the bottom contact. The first dielectric layer may be formed using a directional deposition method. The directional deposition method may include a gas cluster ion beam (GCIB) method.

In block 120, an area around the island is trimmed (e.g., by an etch process) to form a necked down region about the island. In block 122, a gate structure is formed about the island on the first dielectric layer. The gate structure may include a high-k dielectric layer formed over the dielectric surrounding the island/quantum dot. The dielectric surrounding the island/quantum dot may be trimmed to provide an amount of dielectric material to be employed for the gate dielectric. The gate dielectric includes the high-k material and the material of the dielectric surrounding the quantum dot. A gate conductor is formed around the island/quantum dot and recessed to an appropriate height.

In block 124, a second dielectric layer is formed on the gate structure. The second dielectric layer may be formed using a directional deposition method (e.g., GCIB). The first and second dielectric layers may include nitride, although other dielectric materials may be employed. In block 126, a top contact is formed on the second dielectric layer. The top contact is planarized. The top contact forms a drain region, while the bottom contact forms a source region of the vertical single electron transistor. In block 128, processing continues with the formation of metallizations and other structures to complete the device or devices.

Having described preferred embodiments for a vertical single electron transistor formed by condensation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a vertical single electron transistor, comprising;
    forming a heterostructured nanowire having a SiGe region centrally disposed between an upper portion and a lower portion in the nanowire; and
    performing a condensation process to convert the SiGe to oxide and condense Ge to form an island between the upper portion and the lower portion of the nanowire.

2. The method as recited in claim 1, wherein the island includes a quantum dot having a diameter of less than about 6 nm.

3. The method as recited in claim 1, further comprising:
    forming a bottom contact about the lower portion;
    forming a first dielectric layer on the bottom contact;
    forming a gate structure about the island on the first dielectric layer;
    forming a second dielectric layer on the gate structure; and
    forming a top contact on the second dielectric layer.

4. The method as recited in claim 3, wherein at least one of the first dielectric layer and/or the second dielectric layer are formed using a directional deposition method.

5. The method as recited in claim 4, wherein the directional deposition method includes a gas cluster ion beam (GCIB) method.

6. The method as recited in claim 1, wherein forming the heterostructured nanowire includes:
    lithographically etching a stack of layers to form one or more fins; and
    lithographically etching the one or more fins in a fin cut etch to form one or more nanowires.

7. The method as recited in claim 1, wherein forming the heterostructured nanowire includes:
    patterning metal seeds on a semiconductor layer; and
    growing nanowires by a vapor liquid solid growth method.

8. The method as recited in claim 1, further comprising trimming an area around the island to form a necked down region about the island.

9. A method for forming a vertical single electron transistor, comprising;
    forming a nanowire from a first doped silicon layer, a SiGe layer, and a second doped silicon layer on a semiconductor substrate;
    performing a condensation process to convert the SiGe layer to oxide and condense Ge to form an island between the first doped silicon layer and the second doped silicon layer of the nanowire; and
    forming a source/drain region about the first doped silicon layer.

10. The method as recited in claim 9, wherein the island includes a quantum dot having a diameter of less than about 6 nm.

11. The method as recited in claim 9, further comprising:
    forming a gate structure about the island between the first doped silicon layer and the second doped silicon layer of the nanowire; and
    forming another source/drain region about the second doped silicon layer.

12. The method as recited in claim 11, wherein one source/drain region is separated from the gate structure by a first dielectric layer and the other source/drain region is separated from the gate structure by a second dielectric layer.

13. The method as recited in claim 12, wherein the first and second dielectric layers are formed by a directional deposition method including a gas cluster ion beam (GCIB) method.

14. The method as recited in claim 9, wherein forming the nanowire includes:
    lithographically etching the first doped silicon layer, the SiGe layer, and the second doped silicon layer on the semiconductor substrate to form one or more fins; and
    lithographically etching the one or more fins in a fin cut etch to form one or more nanowires.

15. The method as recited in claim 9, wherein forming the nanowire includes:
    patterning metal seeds on a doped silicon layer; and
    growing nanowires by a vapor liquid solid growth method to form the first doped silicon layer, the SiGe layer, and the second doped silicon layer.

16. The method as recited in claim 9, further comprising trimming an area around the island to form a necked down region about the island.

17. A vertical single electron transistor, comprising;
    a nanowire having a lower doped layer and an upper doped layer;
    a quantum dot encapsulated in dielectric material between the lower doped layer and an upper doped layer; and
    a gate structure formed about the quantum dot.

18. The transistor as recited in claim 17, wherein the quantum dot includes a diameter of less than about 6 nm.

19. The transistor as recited in claim 17, further comprising:
    the lower doped layer and the upper doped layer forming source/drain regions, wherein one source/drain region is separated from the gate structure by a first dielectric layer and the other source/drain region is separated from the gate structure by a second dielectric layer.

20. The transistor as recited in claim 17, further comprising a necked down region in an area around the quantum dot.

* * * * *